(12) United States Patent
Karlik et al.

(10) Patent No.: US 10,191,799 B2
(45) Date of Patent: Jan. 29, 2019

(54) BER MODEL EVALUATION

(71) Applicant: SanDisk Technologies LLC, Plano, TX (US)

(72) Inventors: Yonatan Karlik, Petah-Tikva (IL); Judah Gamliel Hahn, Ofra (IL); Ariel Navon, Revava (IL); Alex Bazarsky, Holon (IL); Ofer Shapira, Herzliya (IL)

(73) Assignee: SanDisk Technologies LLC, Plano, TX (US)

( * ) Notice: Subject to any disclaimer, the term of this patent is extended or adjusted under 35 U.S.C. 154(b) by 201 days.

(21) Appl. No.: 15/394,429

(22) Filed: Dec. 29, 2016

(65) Prior Publication Data

US 2018/0189125 A1 Jul. 5, 2018

(51) Int. Cl.
*G06F 11/00* (2006.01)
*G06F 11/07* (2006.01)

(52) U.S. Cl.
CPC .......... *G06F 11/079* (2013.01); *G06F 11/076* (2013.01); *G06F 11/0727* (2013.01)

(58) Field of Classification Search
CPC .. G06F 11/008; G06F 11/079; G06F 11/3409; G06F 11/3452
USPC .......................................................... 714/37
See application file for complete search history.

(56) References Cited

U.S. PATENT DOCUMENTS

| | | | |
|---|---|---|---|
| 9,047,017 B1* | 6/2015 | Dolan | G06F 3/0653 |
| 9,665,288 B1* | 5/2017 | Aharoni | G06F 3/061 |
| 2012/0030506 A1* | 2/2012 | Post | G06F 11/008 |
| | | | 714/6.1 |
| 2012/0094836 A1* | 4/2012 | Bigorra Llosas | A01N 25/02 |
| | | | 504/206 |
| 2013/0086454 A1* | 4/2013 | Rub | H03M 13/05 |
| | | | 714/773 |
| 2016/0118137 A1* | 4/2016 | Zhang | G11C 16/30 |
| | | | 365/185.09 |
| 2016/0147640 A1* | 5/2016 | Huang | G06F 9/524 |
| | | | 717/130 |
| 2016/0196175 A1* | 7/2016 | Kasahara | G06F 11/0751 |
| | | | 714/49 |

* cited by examiner

*Primary Examiner* — Sarai E Butler
(74) *Attorney, Agent, or Firm* — Dickinson Wright PLLC

(57) ABSTRACT

A memory system is configured to perform a test operation to determine a deviation of a target storage location's bit error rate response relative to a model. The memory system determines the deviation level by measuring data sets stored in the target storage location to determine an actual bit error rate value and another actual parameter value used to estimate bit error rate. The memory system obtains an estimated value from the model based on the actual values and identifies the deviation by comparing the estimated value with the actual values.

21 Claims, 8 Drawing Sheets

BER MODEL EVALUATION

BACKGROUND

Memory systems utilize bit error rate (BER) to make various memory decisions. For example, which decoder is activated or which decoder power setting is chosen may be based on the BER. As another example, the BER may be used to detect certain memory-related events, such as data retention or identification of defects in the memory. Subsequent triggering operations, such as data relocation or recovery, may then be performed based on the detection.

For some memory applications, BER may not be actually calculated. Instead, memory systems may utilize models that provide an estimated BER. The models that are used are only theoretical in nature, based on empirical or statistical data that was derived from the behaviors of prior memory systems. In reality, a particular memory system, or particular storage locations of a memory system, may respond differently to a particular stress condition or error-conducive situation compared to an expected response as indicated by the model. Such a different response may provide an inaccurate estimated BER, which in turn may cause the memory system to make incorrect decisions.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF EMBODIMENTS

Overview

Figure 1A:
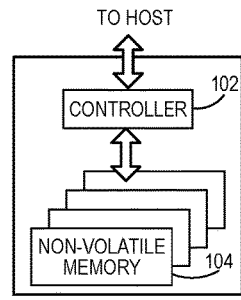
FIG. 1A is a block diagram of an exemplary non-volatile memory system.

By way of introduction, the below embodiments relate to memory systems and methods for identifying a deviation of a particular memory location's response compared to an expected or estimated response as indicated by a BER model. In one embodiment, a storage system includes a memory and a controller. The controller is configured to: read a data set from a target storage location of the memory; measure a first parameter and a second parameter of the data set to obtain a first actual value of the first parameter and a second actual value of the second parameter; apply the first actual value or the second actual value to a model; and based on the application, identify a deviation level of the target storage location relative to the model.

In some embodiments, the controller is configured to derive an expected value corresponding to one of the first actual value or the second actual value in response to application of the first actual value or the second actual value, and compare the expected value with the other of the first actual value or the second actual value. The identification of the deviation level is based on the comparison.

In some embodiments, the controller is configured to compare the deviation level with a threshold value; and identify the target storage location as unusable when the deviation level exceeds the threshold.

In some embodiments, the controller is configured to compare the deviation level with a plurality of thresholds, and categorize the target storage location as being in one of at least three storage usability categories based on the comparison.

In some embodiments, the controller is configured to read the data set and measure the first parameter and the second parameter of the data set during a test phase. During a normal operation phase, the controller is configured to measure the first parameter or the second parameter to identify an estimated value of the other of the first parameter or the second parameter.

In some embodiments, the controller is configured to create an error-conducive condition at or near the target storage location before or while reading the data set from the target storage location.

In some embodiments, the first parameter or the second parameter is a bit error rate.

In some embodiments, the first parameter or the second parameter is a syndrome weight or a generalized syndrome weight.

In another embodiment, a storage system includes a memory and a controller. The controller is configured to: for each of the plurality of data sets stored in a target storage location: measure a first parameter to obtain an associated first actual value and a second parameter to obtain an associated second actual value; apply the associated first actual value to a model to derive an associated expected value of the second parameter; and determine an associated difference between the associated expected value and the associated second actual value. After associated differences are determined for each of the plurality of data sets, the controller is configured to calculate an average difference value for the plurality of data sets; and a storage usability level for the target storage location based on the average difference value.

In some embodiments, the controller is configured to compare the average difference value with a threshold value, and identify the storage usability level as unusable when the average difference value exceeds the threshold.

In some embodiments, the controller is configured to: compare the average difference level with a plurality of threshold values; and identify the storage usability level as being one of at least three storage usability levels based on the comparison.

In some embodiments, the controller is configured to measure the first parameter and the second parameter for each of the plurality of data sets during a test phase. During a normal operation phase, the controller is configured to measure one of the first parameter or the second parameter to identify an estimated value of the other of the first parameter or the second parameter.

In some embodiments, the controller is configured to create an error-conducive condition at or near the target storage location before or while reading the plurality of data sets from the target storage location.

In another embodiment, a method of analyzing a response of a target storage location is performed. The method includes: analyzing, with a controller, a data set to obtain a first actual value of a first parameter and a second actual value of a second parameter of a data set stored in the target storage location of a memory; applying, with the controller, the first actual value to a model to obtain an estimated value of the second parameter; and identifying a deviation level of the target storage location relative to an estimated response indicated by the model.

In some embodiment, the method includes comparing, with the controller, the deviation level with a threshold value; and identifying, with the controller, the target storage location as unusable when the deviation level exceeds the threshold.

In some embodiments, the method includes: comparing, with the controller, the deviation level with a plurality of thresholds; and categorizing, with the controller, the target storage location as being in one of at least three storage usability categories based on the comparing.

In some embodiments, the method includes: determining, with the controller, to perform a test operation, and analyzing the data set, applying the first actual value to the model, and identifying the deviation level is in response to determining to perform the test operation.

In some embodiments, the method includes: creating, with the controller, an error-conducive condition at or near the target storage location; and reading, with the controller, the after or while creating the error-conducive condition.

In another embodiment, a storage system includes: a memory; means for reading a data set from a target storage location of the memory; means for measuring a first parameter and a second parameter of the data set to obtain a first actual value of the first parameter and a second actual value of the second parameter; means for applying the first actual value or the second actual value to a model; and means for identifying a deviation level of the target storage location relative to the model based on the application.

Other embodiments are possible, and each of the embodiments can be used alone or together in combination. Accordingly, various embodiments will now be described with reference to the attached drawings.

Embodiments

The following embodiments describe non-volatile memory systems and related methods for identifying a decision of a particular memory location's response compared to an expected response as indicated by a BER model. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Although in the example illustrated in FIG. 1A, the non-volatile memory system 100 may include a single channel between the controller 102 and the non-volatile memory die(s) 104, the subject matter described herein is not limited to having a single memory channel. For example, in some NAND memory system architectures, 2, 4, 8 or more NAND channels may exist between the controller and the NAND memory die(s) 104, depending on controller capabilities. In any of the embodiments described herein, more than a single channel may exist between the controller and the memory die(s)s 104, even if a single channel is shown in the drawings.

Figure 1B:
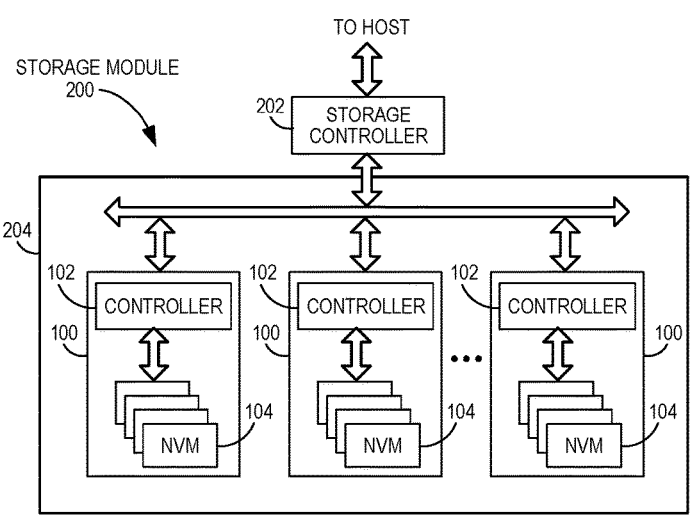
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatilememory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
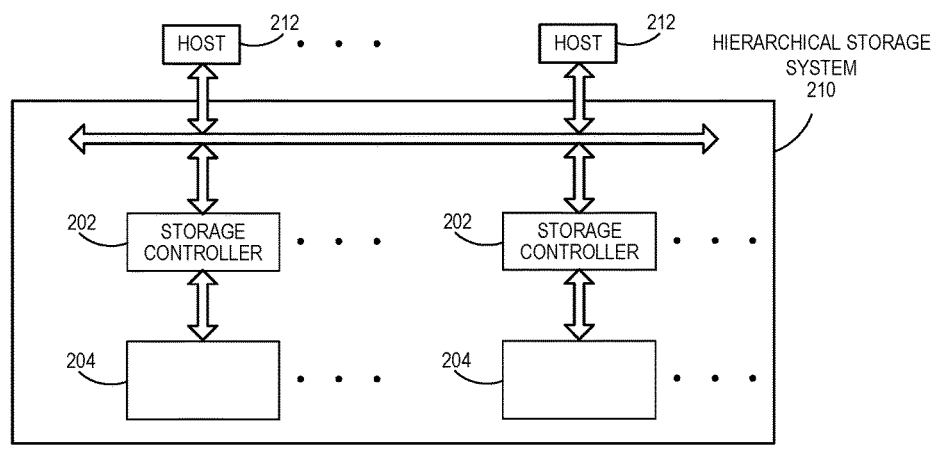
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
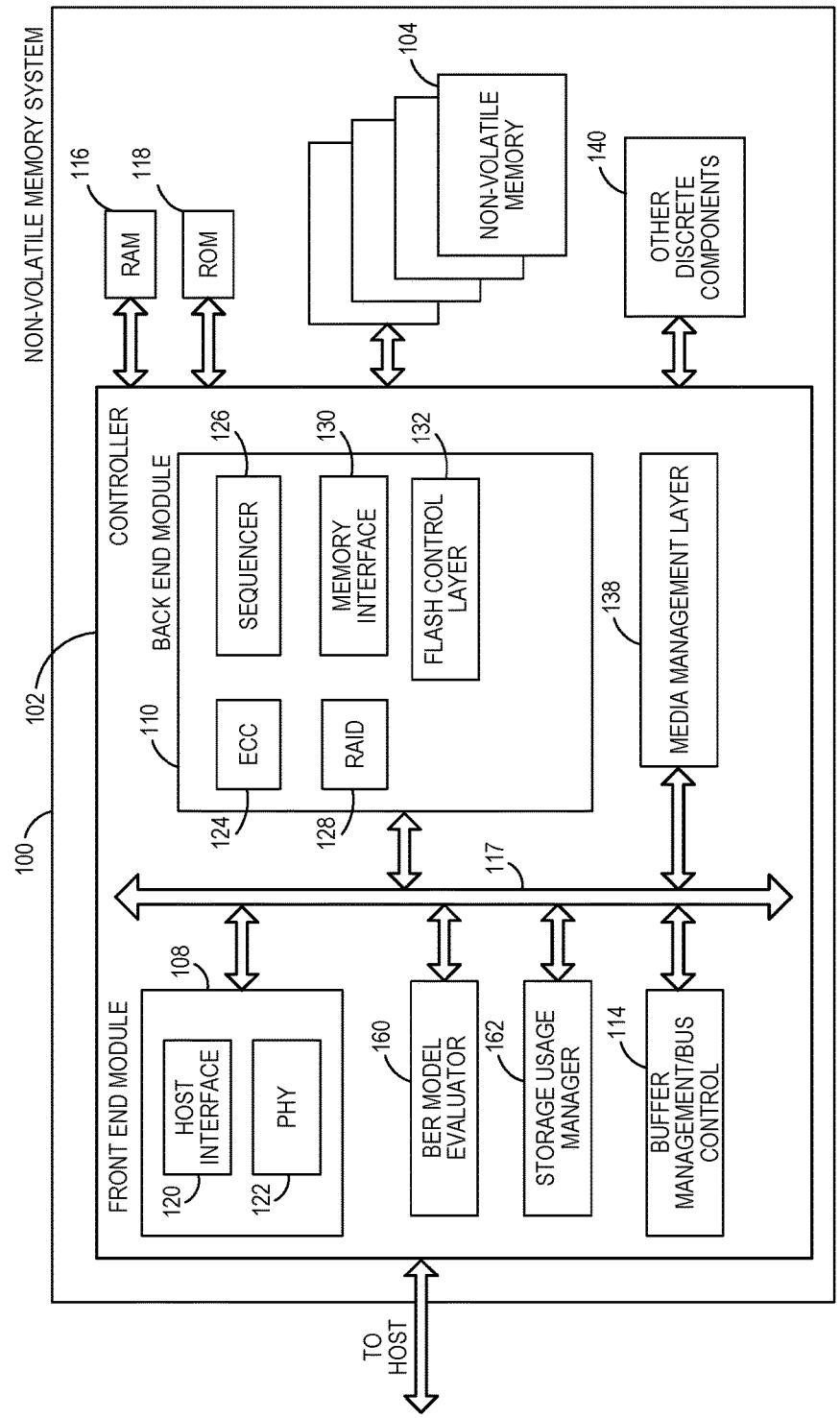
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104.

Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which performs wear leveling of memory cells of the non-volatile memory die 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102. Additionally, the non-volatile memory system 100 may include a bit error rate (BER) model evaluation module 160 and a storage usage management module 162. Further details regarding the BER model evaluation model 160 and the storage usage management module 162 are provided below.

Figure 2B:
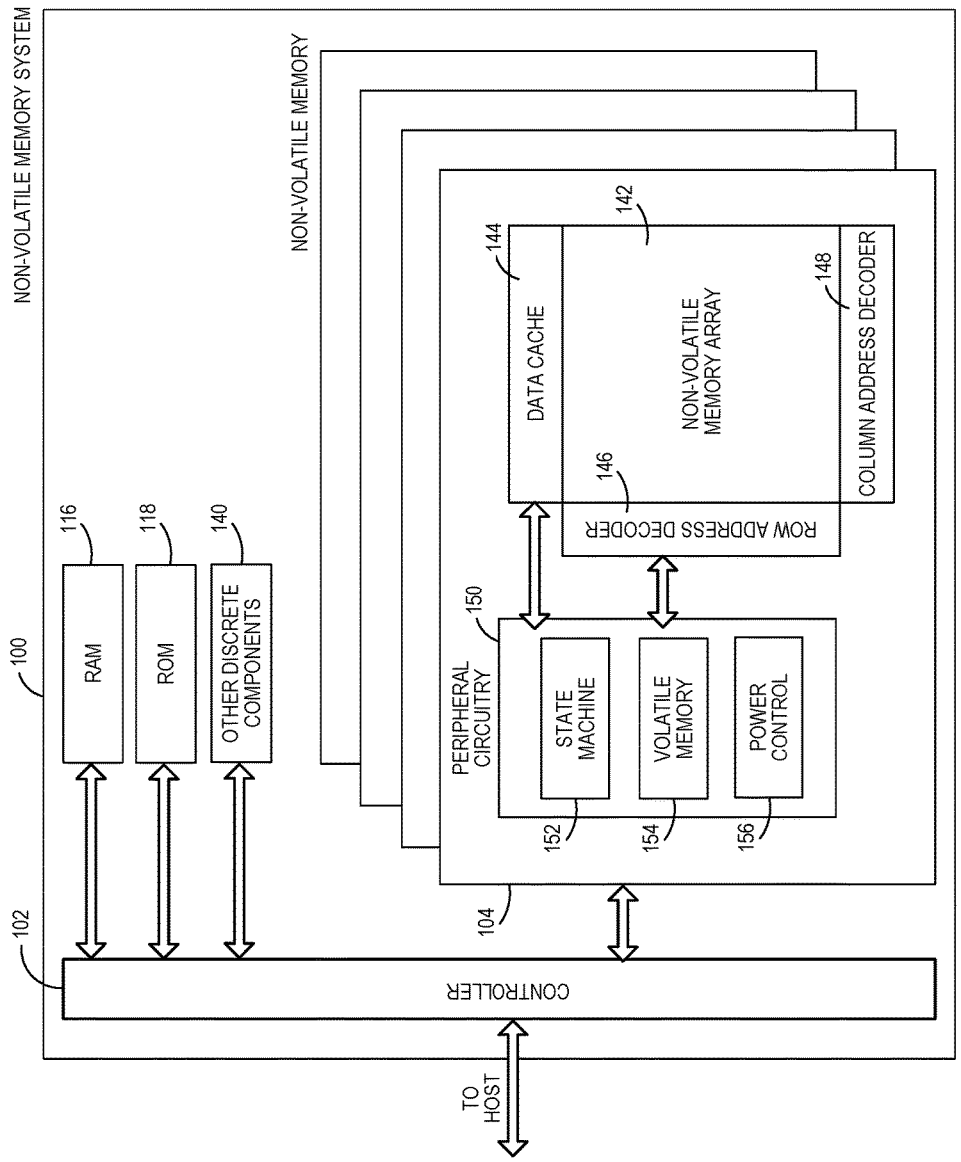
FIG. 2B is a block diagram of exemplary components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits of data per cell, or combinations thereof. For some example configurations, the multi-level cells (MLCs) may include triple-level cells (TLCs) that store three bits of data per cell.

Additionally, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a FGT (or memory cell). A column of FGTs may be referred to as a string. FGTs in a string or column may be electrically connected in series. A row of FGTs may be referred to as a page. Control gates of FGTs in a page or row may be electrically connected together.

The memory array 142 may also include wordlines and bitlines connected to the FGTs. Each page of FGTs is coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 3:
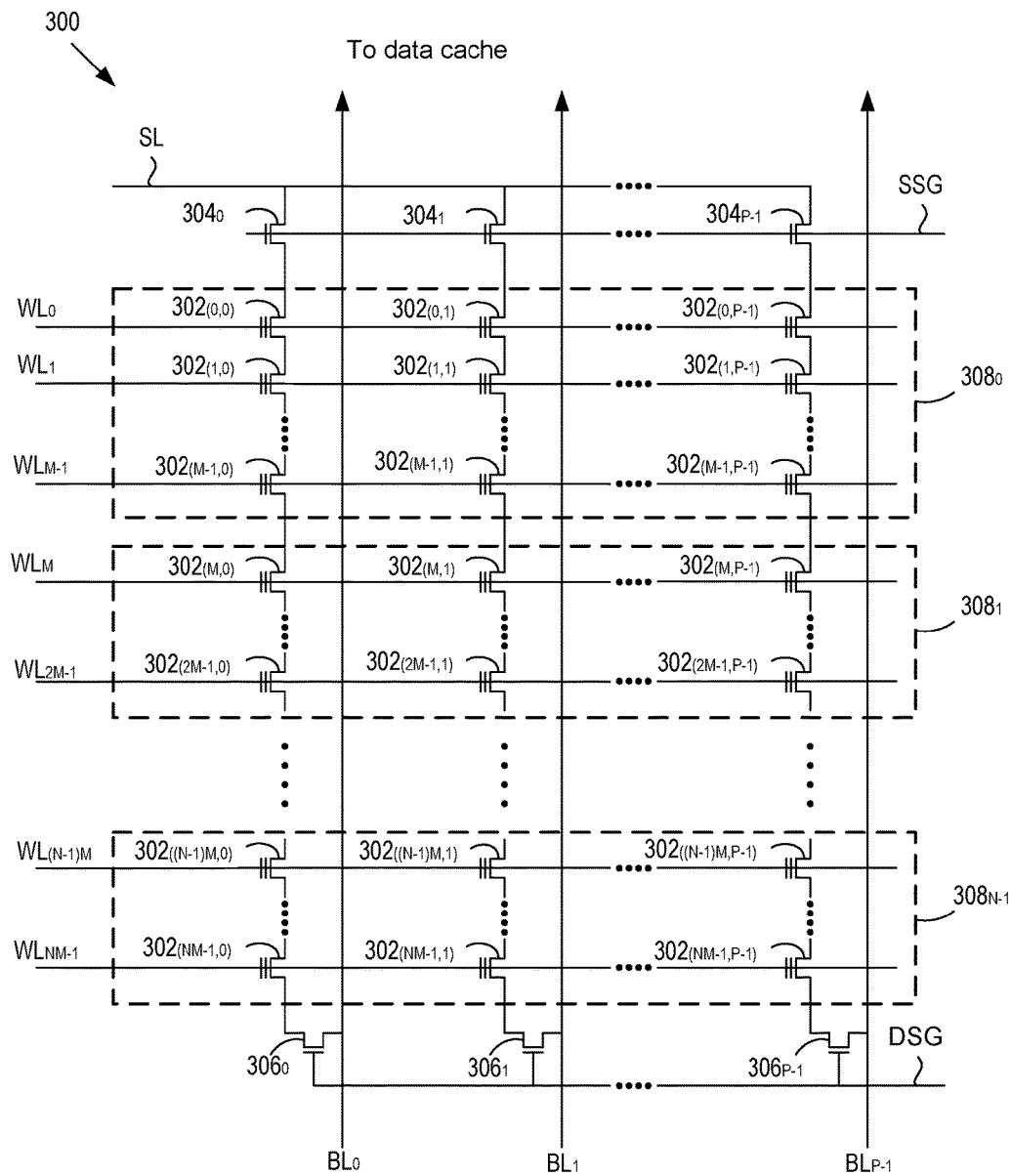
FIG. 3 is a circuit schematic diagram of an exemplary NAND-type flash memory array.

FIG. 3 is a circuit schematic diagram of at least a portion of an exemplary NAND-type flash memory array 300, which may be representative of at least a portion of the memory array 142. The memory array portion 300 may include a P-number of series-connected strings of (N times M) FGTs, each coupled to one of a P-number of bitlines $BL_1$ to $BL_{P-1}$, where N is the number of blocks $308_0$ to $308_{N-1}$ in the memory array 300, and M is the number of pages of FGTs coupled to wordlines WL in each of the N-number of blocks $308_0$ to $308_{N-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor, and may be coupled to its associated bitline BL via a drain select transistor. For example, a first string of FGTs $302_{(0,0)}$ to $302_{(NM-1,0)}$ may be coupled to the source line SL via a source select transistor $304_0$ that is connected to the source line SL, and may be coupled to its associated bitline $BL_0$ via a drain select transistor $306_0$. The other strings may be similarly coupled. Switching of source select transistors $304_0$, $304_1$, ..., $304_{P-1}$ may be controlled using a source select gate bias line SSG that supplies a source select gate bias voltage $V_{SSG}$ to turn on an off the source select transistors $304_0$, $304_1$, ..., $304_{P-1}$. Additionally, switching of drain select transistors $306_0$, $306_1$, ..., $306_{P-1}$ may be controlled using a drain select gate bias line DSG that supplies a drain select gate bias voltage $V_{DSG}$ to turn on and off the drain select transistors $306_0$, $306_1$, ..., $306_{P-1}$.

To program a memory cell, a program voltage is applied to the control gate of the storage element, and the bitline BL associated with the memory cell is grounded. Electrons from the channel are injected into the floating gate of the memory cell. Doing so may cause electrons to accumulate in the floating gate, which in turn may cause the floating gate to become negatively charged and the threshold voltage of the memory cell to be raised. To apply the program voltage to the control gate of the memory cell being programmed, the program voltage is applied on the wordline WL to which the memory cell is coupled. Application of the program voltage may include applying a series or sequence of programming voltage pulses to the control gate of the memory cell being programmed via the wordline WL. In some example configurations, the series of programming voltage pulses may have increasing magnitudes, starting with an initial pulse of the series having an initial program voltage magnitude. As discussed above, one memory cell in each of the strings share the same wordline WL.

Referring back to FIG. 2B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that provides status information to the controller 102 as well as provide chip-level control of memory operations. The peripheral circuitry 150 may also include volatile memory 154. An example configuration of the volatile memory 154 may include latches, although other configurations are possible.

In addition, the peripheral circuitry 150 may include power control circuitry 156 that is configured to generate and supply voltages to the memory array 142, including voltages (including program voltage pulses) to the wordlines, erase voltages (including erase voltage pulses), the source select gate bias voltage $V_{SSG}$ to the source select gate bias line SSG, the drain select gate bias voltage $V_{DSG}$ to the drain select gate bias line DSG, as well as other voltages that may be supplied to the memory array 142. In one example configuration, the power control circuitry may include charge pumps to generate the voltages, although other configurations may be possible.

Figure 4:
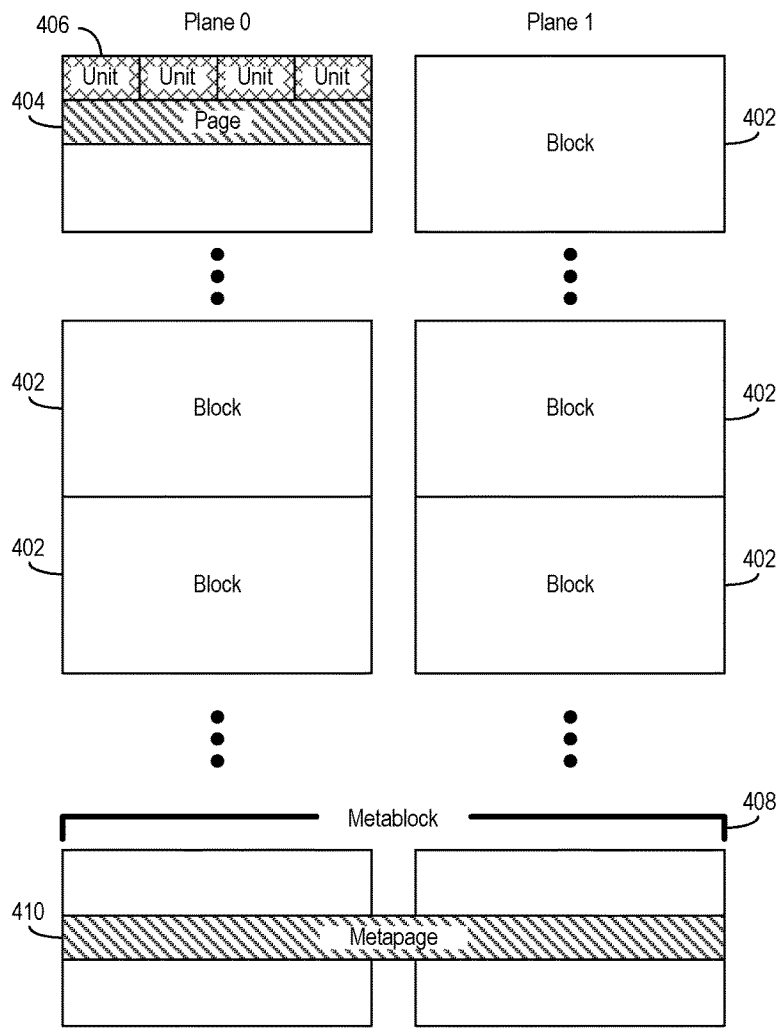
FIG. 4 is a block diagram of an example organizational arrangement or hierarchy of a memory array for flash memory.

Referring to FIG. 4, the memory array 142 and/or a plurality of memory arrays 142 spanning multiple memory dies 104 may have an organizational arrangement or hierarchy under which memory elements or cells of the memory array 142 and/or multiple memory arrays 142 of multiple memory dies 104 may be organized. The controller 102 may be configured to store and access data in accordance with the organizational arrangement or hierarchy.

FIG. 4 is a block diagram of an example organizational arrangement or hierarchy of a memory array 142 for flash memory. As mentioned, for flash memory, the memory cells may be divided or organized into blocks 402, and each block 402 may further be divided into a number of pages 404. Each block 402 may contain the minimum number of memory elements that may be erased together. In addition, each page 404 may be a unit of sensing in the memory array 142. Each individual page 404 may further be divided into segments or units 406, with each segment or unit 406 containing the fewest number of memory cells that may be written to at one time as a basic programming operation. Data stored in a segment or unit of memory cells—referred to as a flash memory unit (FMU), an ECC page, or a codeword—may contain the amount of data that is written at one time during a basic programming operation and/or the amount of data that can be encoded or decoded by the ECC engine 124 during a single encoding or decoding operation. The pages 404 may be divided into the same number of segments or units. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 402 may be configured. Generally, a plane includes a "column" of blocks 402, although other configurations may be possible. A single memory array 142 may include a single plane or multiple planes. The example arrangement shown in FIG. 4 includes two planes, Plane 0 and Plane 1. Data stored in different planes may be sensed simultaneously or independently.

Additionally, the organizational arrangement or hierarchy may include metablocks 408 and metapages 410. A metablock address or number identifying a metablock may be mapped to and/or correspond to a logical address (e.g., a logical group number) provided by a host. A metablock 408 and a metapage 410 may span or be distributed across a respective single block and page in a single plane, or alternatively, may span or be distributed across respective multiple blocks and multiple pages across multiple planes. FIG. 4 shows the metablock 408 and the metapage 410 spanning across two planes, Plane 0 and Plane 1. Depending on the organizational arrangement, metablocks 408 and metapages 410 spanning across multiple planes may span across only those planes of a single memory die 104, or alternatively may span across multiple planes located of multiple memory dies 104.

Referring back to FIGS. 2A and 2B, to read a data set from a memory die 104, the data set may be sensed into the data cache and then loaded into the RAM 116 via the memory interface 130. The sequencer module 126 may issue one or more sense and data transfer commands to have the data set sensed and then transferred into the RAM 116. Thereafter, the ECC engine 124 may perform error correction and decode the data set. If the data set is being read in response to a host read request during normal of operation of the non-volatile memory system 100, the data set, after undergoing error correction, may then be sent back to the host via the host interface 120.

The ECC engine 124 may perform error correction on the data set before it is sent back from the host because the data set may contain errors, meaning bit values originally programmed as having a logic "1" value may be read as having a logic "0" value or vice versa. A data set that is programmed into the non-volatile memory dies 104 may include information bits, which includes the raw data that the host wants stored in the dies 104, and parity bits, which is generated during encoding of the data. During decoding, the ECC engine 124 may use the parity bits to determine if the data set has errors and if so, which bits to correct (i.e., change or flip bit values).

As previously described, a data set that is stored in a segment of storage, sensed in a single sense operation, and decoded during a single decode operation may be referred to as a codeword. When the codeword is loaded from the dies 104 into the RAM 116, its bit error rate (BER) may be determined. The BER may identify the number or amount of errors in the codeword. Various components of the controller 102 or other components of the non-volatile memory system 100 may utilize the BER for making one or more memory decisions. For example, the ECC engine 124 may choose a mode in which to decode the codeword or a power setting in which to decode the codeword. The lower the BER, the less power the ECC engine 124 may decide to use to decode the codeword. As another example, if the BER is above a threshold, the flash control layer module 132 and/or the media management layer module 138 may determine to relocate the codeword to a different storage location because such a BER may indicate that the segment storing the codeword is becoming unreliable. In addition or alternatively, if the BER is above a threshold, the flash control layer 132 may re-calibrate or re-select memory read parameters (e.g., read threshold voltage levels or read noise threshold levels) or decode parameters (e.g., log-likelihood ratio (LLR) values associated with hard bit and/or soft bit values, a mode of decoding, or a time out value (i.e., number of decoding iterations). In addition or alternatively, the non-volatile memory system 100 may alert a host to potential memory loss or degradation when the BER exceeds a certain threshold. In addition or alternatively, future reads to the location where the codeword is stored and/or to retrieve the codeword may be aborted or delayed until corrective action is performed, such as by adjusting read parameters, rewriting the codeword to a different location, or reassigning other data with high error rates to the location. Other memory decisions based on identifying the BER may be possible.

During normal operation when the controller 102 is reading data from the memory dies 104 in response to those read requests, instead of measuring the BER to obtain an actual BER value for a given codeword, the ECC engine 124 may determine or calculate an estimated BER value instead, since estimating the BER may be easier or faster than measuring the BER to obtain an actual BER value. The actual BER value for a given codeword may be the fraction or percentage of bits of the codeword that the ECC engine 124 corrected (i.e., changed from 0 to 1 and from 1 to 0) in order to obtain a corrected or error-free codeword. In order to estimate the BER, the ECC engine 124 may use a BER model that correlates BER with another parameter that may be measured or calculated from the codeword. That other parameter is referred to herein as a health meter (HM). Instead of measuring the BER to obtain an actual BER value, the ECC engine may instead measure the HM to obtain an actual HM value. The ECC engine 124 may then apply the actual HM value to the BER model to derive an estimated BER value for the BER of the codeword.

One example health meter may be syndrome weight (SW). When low-density parity-check (LDPC) codes are used to encode and decode the data, one example BER model utilizes syndrome weight to derive an estimated BER value. Syndrome weight is the sum of syndrome values for all of the checks (or check nodes) associated with a codeword. In further detail, an LDPC code has a corresponding parity-check matrix H. When encoding raw data to generate a codeword, the ECC engine 124 may utilize the parity-check matrix H to generate parity bits such that the following matrix equation is satisfied:

$$H\omega = 0, \qquad (1)$$

where H is the parity-check matrix and ω is the codeword including the information bits and the parity bits. The codeword ω may be formatted such the first K bits of the codeword ω are equal to an information bit sequence β of the information bits, and the last M bits of the codeword ω are equal to the parity bit sequence δ of the parity bits. The parity bit generator module 502 may then generate the parity bits such that the following equation is satisfied:

$$H \cdot \begin{bmatrix} \beta \\ \delta \end{bmatrix} = 0. \qquad (2)$$

In some LDPC encoding schemes, the parity bit generator module 502 may generate the parity bit sequence δ by taking advantage of the sparse nature of the parity-check matrix H in accordance with LDPC.

Figure 5:
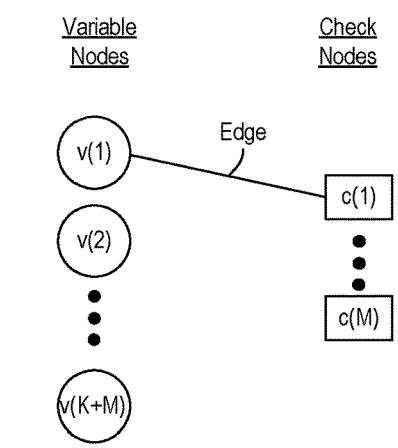
FIG. 5 is a schematic diagram of a partially completed Tanner graph.

The parity-check matrix H may have a corresponding Tanner graph. FIG. 5 shows a schematic diagram of a partially completed Tanner graph corresponding to a parity-check matrix H. In general, a Tanner graph may include variable nodes (or just variables), check nodes (or just checks), and edges connecting the check nodes and the variables nodes. The number of variable nodes may be equal to the number of columns in the parity-check matrix H and the number of bits in a codeword ω. Accordingly, there may be a K+M number of variable nodes v(1) to v(K+M) corresponding to the K-number of bits in the information bit sequence β and the M-number of parity bits of the parity bit sequence δ. The number or check nodes may be equal to the number of rows in the parity-check matrix H and the number of parity bits in the parity bit sequence δ. Accordingly, there may be an M-number of check nodes c(1) to c(M) corresponding to the M-number of parity bits in the parity bit sequence δ. A particular variable node may be connected to a particular check node via an edge or connection if the element in the parity-check matrix H corresponding to that variable node and that check node has a 1 value instead of a 0 value. For example, FIG. 5 shows an edge connecting the first variable node v(1) and the first check node c(1).

When a codeword is read, to measure the syndrome weight for the codeword, the ECC engine 124 may calculate syndrome values $s_c$ for each of the check nodes. The ECC engine 124 may use information associated with the parity-check matrix H and/or the corresponding Tanner graph used to encode the codeword, and assign bit values $b_v$ to each of the variables v according to the corresponding bit values of the bits of the read codeword. The ECC engine 124 may calculate a syndrome value $s_c$ for each check node c according to the following equation:

$$s_c \leftarrow \sum_{v \in N(c)} b_v \mathrm{mod} 2, \qquad (3)$$

where $s_c$ denotes the syndrome value for a given check node c, the term v∈N(c) denotes all of the variables v that are neighboring (i.e., connected to) to the given check node c, $b_v$ denotes the bit values of the variables v, and mod2 denotes that the summation is a modulo 2 summation (or an XOR calculation). A syndrome value $s_c$ of 0 may indicate that the associated check c is satisfied, and a syndrome value $s_c$ of 1 may indicate that the associated check c is unsatisfied.

When the syndrome values $s_c$ are calculated for all of the checks, the ECC engine 124 may then calculate a syndrome weight value SW for the codeword according to the following equation:

$$SW = \sum_{c \in C} s_c, \qquad (4)$$

where SW denotes the syndrome weight, c denotes a check node, C denotes the group of all check nodes associated with the codeword, and the term c∈C denotes all check nodes belonging to the group C. In other words, the syndrome weight SW is the sum of the syndrome values for all of the check nodes.

Another example health meter may be generalized syndrome weight (GSW). Generalized syndrome weight may be a vector of numbers, where each number in the vector indicates a count of bits that are associated with a certain number of unsatisfied checks. To illustrate as a non-limiting example, in a coding scheme in which each variable node may be associated with at most three check nodes (i.e., may be connected to at most three check nodes and/or participate in up to three parity check equations), the generalized syndrome weight (GSW) may be a vector of four numbers, where a first number is a first count of variables associated with zero unsatisfied checks, a second number is a second count of variables associated with one unsatisfied check, a third number is a third count of variables associated with two unsatisfied checks, and a fourth number is a fourth count of variables associated with three unsatisfied checks. Other ways to determine the GSW vector may be possible. For example, the vector may include two numbers, where a first number is a sum of the first and second counts, and a second number is a sum of the third and fourth counts. Other vector that involve other ways to sum the counts may be possible.

A third example health meter may be the number of cycles or iterations that the ECC engine 124 used to correct the codeword. A fourth example health meter may be the number of bits of the codeword that the ECC engine 124 corrected (i.e., changed from 0 to 1 and from 1 to 0) in order to obtain a corrected or error-free codeword. Other parameters measured from a read codeword to be used for the health meter value may be possible.

Referring back to the example BER model, the BER model may provide a correlation (such as a one-to-one correspondence for example) between a health value and a BER value. In some example configurations, the BER model may provide a function, where the health meter value is a function of the BER value, or vice versa. In addition or alternatively, the BER model may provide a table. Regardless, the BER model may be configured so that knowing a value for one of the parameters, a corresponding value for the other parameter can be obtained. Accordingly, when a codeword is read and loaded into the RAM 116, the ECC engine 124 may calculate the health meter to obtain an actual or measured health meter value of the codeword. The ECC engine 124 may then apply the actual health meter value to the BER model to derive an estimated BER value. The ECC engine 124, and the rest of the components of the non-volatile memory system 124, may use the estimated BER value for the BER of the codeword. In other words, instead of measuring the BER to obtain an actual BER value, the ECC engine 124 calculates an actual health meter value and uses it along with the BER model to obtain an estimated BER value.

The BER model that the ECC engine 124 uses may be based on empirical or historical data that statistically describes how similar memory systems respond to given error-conducive situations. However, memory dies of a particular memory system, or one or more particular storage locations of a particular memory system, such as blocks of the dies, may respond differently than how the BER model indicates they should respond. Under these circumstances, the estimated BER value that the ECC engine 124 derives from the BER model may not accurately reflect, within an acceptable margin, the actual BER value. In turn, components of the non-volatile memory system 100 may make wrong decisions when relying such a derived estimated BER value.

The non-volatile memory system 100 of the present description includes a BER model evaluator module 160 that performs a test operation that measures a particular storage location's response to error-conducive conditions compared to a BER model. In particular, the BER model evaluation module 160 is configured to measure, for a given codeword read from the particular storage location, both the BER to obtain an actual BER value and the health meter (e.g., syndrome weight) to obtain an actual heath meter (HM) value. The BER model evaluation module 160 may then apply the actual BER value or the actual HM value to the BER model to derive an expected value associated with one of the actual values. The BER model evaluation module 160 may compare the expected value with the other of the actual values and obtain a difference value. In some configurations, the particular storage location may store multiple codewords, in which case, the BER model evaluation module 160 may be configured to obtain a difference value for each of the codewords, and then average the difference values to obtain an averaged difference value. The difference value, or the averaged difference value, may indicate or provide a deviation level of the response of the particular storage location from the BER model. The BER model evaluation module 160 may then provide the difference value, or the averaged difference value, to another management module for further processing and decision making. For example, a storage usability management module may be configured to assess a level of usability of the storage location based on the difference or average difference value it receives.

In some example configurations, the BER model evaluation module 160 may be configured to create a physical disturbance to create the error-conducive condition. The physical disturbance may induce or accelerate the creation of errors. The BER model evaluation module 160 may then read one or more codewords from the particular storage location while the particular storage location is being subjected to the physical disturbance.

In addition, the BER model evaluation module 160 may be configured to operate in a test mode or test phase of operation. In the test mode, the BER model evaluation module 160 may measure both the BER and the HM for a codeword. In contrast, in the normal operation mode, the non-volatile memory system 100 may use the BER model to derive an estimated BER value. Further, the BER model evaluation module 160 may be run during or as part of a production process when testing the non-volatile memory system 100. In addition or alternatively, the BER model evaluation module 160 may operate as part of a background process in back of the normal operation mode of the non-volatile memory system 100.

FIG. 2A shows the BER model evaluation module 160 as a separate component of the controller 102 from the ECC engine 124. In other example configurations, the BER model evaluation module 160, or at least some of its components, may be considered part of the ECC engine 124 or another component of the controller 102 or the non-volatile memory system 100 in general.

Figure 6:
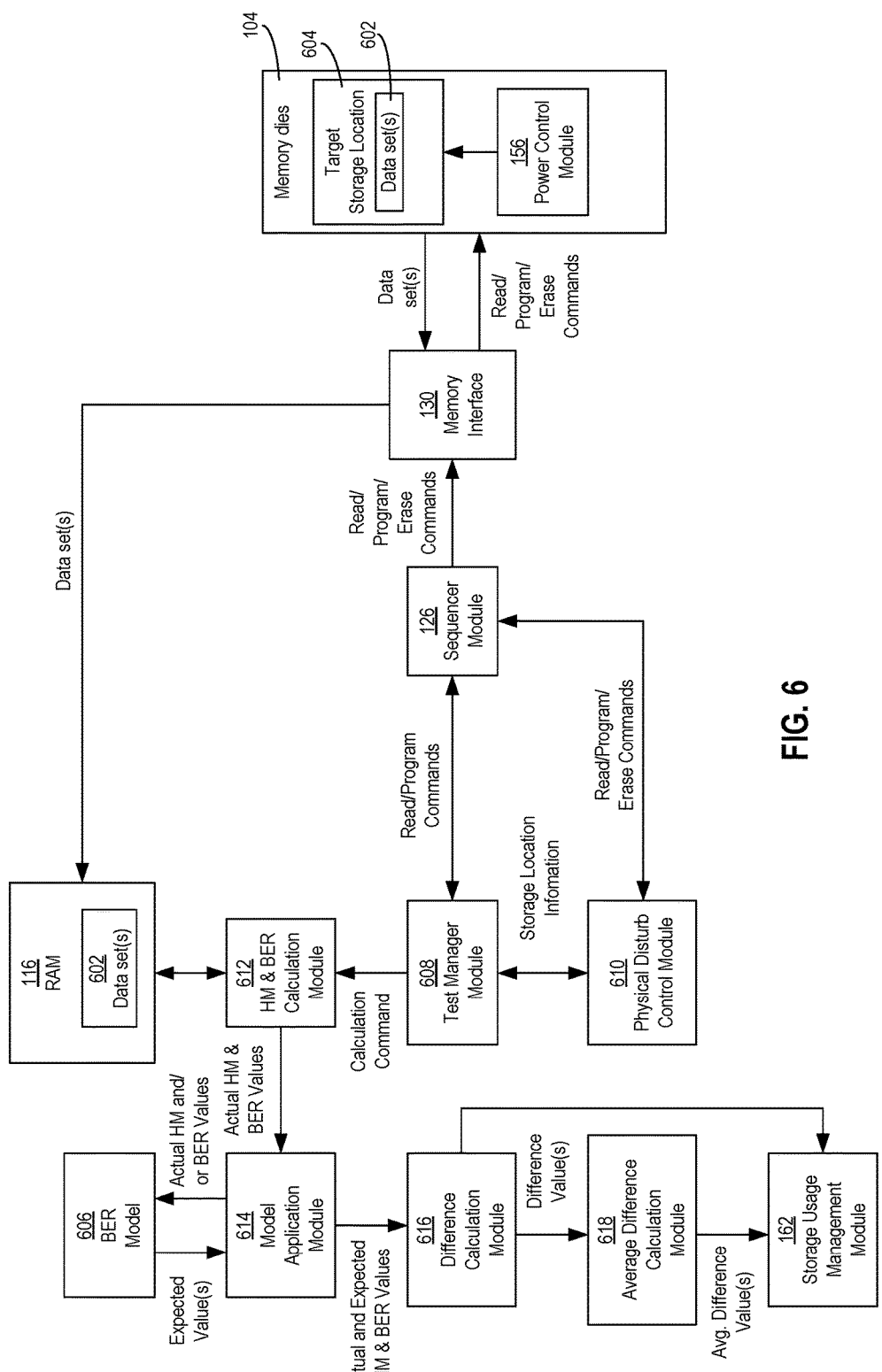
FIG. 6 is a block diagram of exemplary modules of the controller of FIG. 2A used to perform a test operation to measure a target storage location's bit error rate relative to a model.

FIG. 6 shows a block diagram of example components of the BER model evaluation module 160 that may be involved in the test operation. In general, the test operation involves retrieving one or more data sets (e.g., codewords) 602 from a target storage location (e.g., target block) 604 of the memory dies 104, measuring the HM and BER of the data sets to obtain actual HM and BER values, and applying the actual HM and BER values to a BER model 606 to obtain a deviation level of target storage location 604 relative to the BER model 606. The deviation level may be indicated by a difference, or an average difference, between an expected level derived from the BER model 606 and one of the actual HM and BER values. The deviation level, or the difference, may then be used for further decision making in the non-volatile memory system 100.

The BER evaluation module 160 may include a test manager module 608 that is configured to initiate and coordinate the test operation with the other components of the BER evaluation module 160. The test manager module 608 may be configured to initiate the test operation in response to a triggering event. Various types of triggering events are possible. One triggering event may be receipt of a host request that is requesting the test to be performed. Another triggering event may be an internal detection made, either by the test manager module 608 or another component of the non-volatile memory system 100, indicating to perform the test operation. Non-limiting internal triggering events may include detection of a time, a measured BER level for data stored in the target storage location 604 being above a certain level, a number of uncorrectable errors associated with the target storage location 604, or a number of program-erase cycles for the target storage location 604. Other external or internal triggering events may be possible.

In response to and/or in conjunction with determining to initial the test operation, the test manager module 608 may identify the target storage location 604 in various ways. For example, the target storage location 604 may be associated with the triggering event, such as by being identified in the host request or causing the internal triggering event. For other test operations, the test manager module 608 may select the target storage location 604 at random. For other test operations, the target storage location 604 may be one of a group of target storage locations of the memory dies 104. The group may be smaller than all possible storage locations of the memory dies 104 (e.g., where the test operation is or is part of a short self-test), or may include all of the storage locations of the memory dies 104 (e.g., where the test operation is or is part of an extended self-test). Other ways in which the target storage location 604 is identified may be possible.

In addition, the test manager module 608 may be configured to control the setup of the conditions for reading the data set(s) 602 from the target storage location 604. For at least some test operations, it may be desirable to evaluate the target storage location 604 against the BER model 606 when the target storage location 604 is subjected to an error-conducive condition that induces or accelerates an amount of errors in a data set read from the target storage location 604. Creating an error-conducive condition may include creating a physical disturbance or physical stress at or near the target storage location 604. Various was of the creating the physical disturbance or stress may be possible, some of which are described below.

Setting up the conditions for reading the data set(s) 602 from the target storage location 604 may also include determining whether the data set(s) 602 first need to be stored in the target storage location 604. If data is not already being stored in the target storage location 604, or if the test manager module 608 wants new data stored in the target storage location 604, then the test manager module 608 may determine to have the data set(s) 602 programmed in the target storage location 604. In some example test operations, if data is to be programmed upon initiation of the test operation, the power control module 156 may program one or more of the data set(s) 602 at elevated (higher than default) program levels in order to create the physical disturbance or stress condition. For other test operations, the power control module 156 may program the data set(s) at normal or default program levels. In order to have the data set(s) 602 programmed, the test manager module 608 may communicate program commands directly to the sequencer module 126, which may cause the sequencer module 126 to issue program commands to the memory dies 104 via the memory interface 130 to program the data set(s) 602. The program commands may include storage location information, the data that is to be programmed or information identifying the data or a data pattern of the data to be programmed, and voltage level information indicating the voltage levels at which to program the data. Alternatively, the test manager module 608 may communicate with a physical disturb control module 610 to have the data set(s) 602 programmed. For example, the test manager module 608 may provide the storage location information to the physical disturb control module 610. In turn, the physical disturb control module 610 may provide one or more program commands to the sequencer module 126. Further description of the physical disturb control module 610 is provided in further detail below. For still other test operations, the data set(s) 602 may already be stored in the target storage location 604 upon initiation of the test operation, in which case an initial programming of the data set(s) 602 may not be performed.

When determining to read the data set(s) 602 from the target storage location 604, the test manager module 608 may determine whether to create an error-conducive condition before and/or while reading the data set(s) 602. For some test operations, the test manager module 608 may determine that the target storage location 604 is already being subjected to a physical disturbance or stress, such as one occurring naturally or during the normal operation of the memory system 100, or because the data set(s) were programmed at elevated voltage levels, and so one does not need to be created. In general, the test manager module 608 may determine not to create an error-conducive condition.

Alternatively, the test manager module 608 may determine to create an error-conducive condition at or near the target storage location 604 before and/or while reading the data set(s). Upon determining to create the error-conducive condition, the test manager module 608 may communicate with the physical disturb control module 610, such as by providing the storage location information to the physical disturb control module 610, in order to have the error-conducive condition created. In turn, the physical disturb control module 610 may be configured to identify and/or generate an error-conducive plan and provide information, such as read commands, program commands, erase commands, or some combination thereof, to the sequencer module 126 to have the error-conducive condition created at or near the physical storage location 604. Various ways of creating the error-conducive condition are possible. For example, the physical disturb control module 610 may be configured to read the data set(s) at elevated read voltage levels. Accordingly, the physical disturb control module 610 may provide information to the sequencer module 126 to cause the sequencer module 126 to issue read commands to the memory dies 104 to have the data sensed at elevated read voltage levels. As another example, the physical disturb control module 610 may be configured to create a physical disturbance near the target storage location, such as by performing one or a series of read operations on storage locations near the target storage location 604. Doing so may generate heat and increase the temperature of the target storage location 604, creating a temperature difference between the initial program temperature and the read temperature. Similar effects may be achieved by performing one or more program operations and/or erase operations. In general, the test manager module 608 and/or the physical disturb control module 610, may provide some combination of read, program, and erase commands or other information to the memory dies 104 via the sequencer module 126 and the memory interface 130, in order to have physical stress or a physical disturbance created at or near the target storage location 604. Such commands and/or information may be provided according to an error-conducive plan. In response, one or more actions may be performed on the dies 104 to create physical stress and/or a physical disturbance, such as through wear (series of program, read, and/or erase operations), generation of heat, and/or elevated voltage levels. Various ways of creating the error-conducive condition may be possible.

After or upon creating the error-conducive condition, the test manager module 608 and/or the physical disturb control module may communicate with the sequencer module 126 to have the data set(s) 602 retrieved from the target storage location 604 and loaded into the RAM 116. The sequencer module 126 may issue one or more read context commands, such as sense and data transfer commands, to have the data set(s) 602 sensed from the target storage location 604 and loaded into the RAM 116 via the memory interface 130. For some test operations, a single data set 602 may be loaded into the RAM 116. For other test operations, multiple data sets may be loaded into the RAM 116. For example, the target storage location 604 may be a block, and one, some but less than all, or all of the codewords stored in the block may be retrieved and loaded into the RAM 116.

After a data set is loaded into the RAM 116, a health meter (HM) and bit error rate (BER) calculation module 612 may be configured to measure the HM and the BER of the data set to obtain measured or actual HM and BER values of the data set 602. The HM and BER calculation module 612 may measure the actual BER by comparing the bit values of the initial bit sequence of the data set 602 before it was programmed to the bit values of the bit sequence of the data set 602 after it is loaded into the RAM 116. In addition, where syndrome weight is the health meter, the HM and BER calculation module 612 may measure the syndrome weight in accordance with equations (3) and (4) as described above. For some example configurations, the test manager module 608 may be configured to determine when the data set 602 is loaded into the RAM 116, and in response provide a calculation command to the HM and BER calculation module 612 to perform their calculations.

Upon obtaining the actual HM and BER values of the data set 602, the HM and BER calculation module 612 may provide the actual HM and BER values to a model application module 614. In response, the model application module 614 may apply the actual HM and BER values to the BER model 606, or otherwise access the BER model 606, and using the BER model, derive at least one expected or estimated value. As previously described, the BER model 606 may provide a correlation or correspondence between HM values and BER values, such as over a range of HM values and a corresponding range of BER values. For some test operations, the model application module 614 may apply the actual HM value to the BER model 606 to derive an expected or estimated BER value corresponding to that actual HM value. For other example test operations, the model application module 614 may apply the actual BER value to the BER model 606 to derive an expected or estimated HM value corresponding to that actual BER value.

The BER model 606 may be stored in any or a plurality of storage locations within the non-volatile memory system 100 and/or external to the non-volatile memory system 100. For example, the memory dies 104 may store the BER model 606. In addition or alternatively, the BER model 606 may be stored in the RAM 116. For example, upon starting or initializing the test operation, a copy of the BER model 606 may be loaded into the RAM 116, either by retrieving the BER model 606 from the memory dies 104, or from a source external the memory system 100, such as a host.

Upon obtaining the expected value(s), the model application module 614 may provide the expected value(s) and one or both of the actual values to a difference calculation module 616. In response, the difference calculation module 616 may be configured to compare the expected value with one of the actual values in order to identify a difference between the expected value and the actual value. For example, if the model application module 614 obtained an expected HM value, the difference calculation module 616 may compare the expected HM value with the actual HM value to identify a difference between the expected and actual HM values. Alternatively, if the model application module 614 obtained an expected BER value, the difference calculation module 616 may compare the expected BER value with the actual BER value to identify a difference between the expected and actual BER values.

If multiple data sets 602 are loaded into the RAM 116 (e.g., if the target storage location 604 is a block and multiple codewords stored in the target storage location 604 are loaded into the RAM 116), then the HM and BER calculation module 612, the model application module 614, and the difference calculation module 616 may perform their respective functions for each of the multiple data sets to obtain a plurality of difference values, each for one of the data sets. The difference calculation module 616 may be configured to provide each of the difference values to an average difference calculation module 618. In response, the average difference calculation module 618 may be configured to calculate an average difference of the plurality of difference values.

After the average difference value is calculated, the average difference calculation module 618 may provide the average difference value for further processing to one or more modules that may use this average difference value for further memory management decision making. In this regard, the average difference value may represent a deviation of the response of the target storage location 604 from an expected or estimated response provided from the model.

An example further processing module may be a storage usage management module 162. The storage usage management module 162 may be configured to assess or identify a usability level or other usability characteristic of the various storage locations (e.g., blocks) of the non-volatile memory dies 104. For example, the storage usage management module 162 may maintain a bad storage list (e.g., a bad block list) that identifies blocks that are unusable and/or not to be used for storage during operation. The storage usage management module 162 may receive the average difference value, and in response, compare the average difference value with a threshold. If the average difference value is greater than the threshold, then the storage usage management module 162 may determine that the target storage location's storage behavior or response to error-conducive conditions is too far from the model, and should therefore not be used. Accordingly, the storage usage management module 162 may add the target storage location 604 to the bad storage list. Alternatively, if the average difference value is below the threshold, then the storage usage management module 162 may identify the target storage location 604 as usable for storage and not add the target storage location 604 to the bad storage list.

In other or additional configurations, the storage usage management module 162 may assess more than two storage usability levels for the storage locations of the memory dies 104. That is, in addition to usable (good) and unusable (bad), the storage usage management module 162 may assess one or more intermediate levels. Storage locations being assessed with an intermediate level may not be labeled as completely unusable, but instead may be used for storage of certain types of data (e.g., storage of metadata used to recover data, redundant data having lower error correction requirements, temporary data, including temporary data used for obsolete blocks, or log files, as non-limiting examples), and/or may be stored with data that is encoded with a higher or increased amount of parity bits (i.e. lower code rate) in order to compensate for the reduced reliability provided by intermediate-level storage locations. Alternatively, future data written to intermediate-level storage locations may be written using different program parameters (e.g., an increased amount of write verification steps) to improve reliability at the expense of program time. In this regard, the storage usage management module 162 may utilize multiple thresholds in order to determine whether to assign a given storage location as usable, unusable, or an intermediate usability level.

In addition, for some example configurations, the difference value(s) and/or the average difference value may be sent back to the host system or other external electronic computing device, such as part of a reporting operation. In turn, the host system may use the difference value information to assess device reliability of the memory system 100. In some example situations, the host may identify that the difference value information has exceeded a threshold, and in response, trigger a host re-assessment of device usability of the memory system 100 even though no actual data loss has occurred.

Referring back to the difference calculation module 616, if only a single data set 602 is loaded into the RAM 116 and/or only to be analyzed for performance of the test operation, then the average difference calculation module 618 may not be used or bypassed, and the difference value determined by the difference calculation module 616 may be provided directly to one or more of the further processing modules, as shown in FIG. 6.

The above-described test operation can be performed on a single storage location or a plurality of storage locations. For example, after a difference value or an average difference value is determined for one target storage location, the BER model evaluation module 160 may move on to a next target storage location (e.g., block). In some situations, the BER model evaluation module 160 may perform the test operation on all of the target storage locations (e.g., all of the blocks) of a single die 104, or on all of storage locations (e.g., blocks) of all the dies 104 of the system 100. In other situations, the BER model evaluation module 160 may perform the test operation on only a subset of all of the storage locations, such as on only some of the blocks on a single die, or on only some of the blocks of each of the dies 104. Various ways to implement the test operation of the various storage locations of a single-die or a multi-die memory system 100 may be possible.

Figure 7:
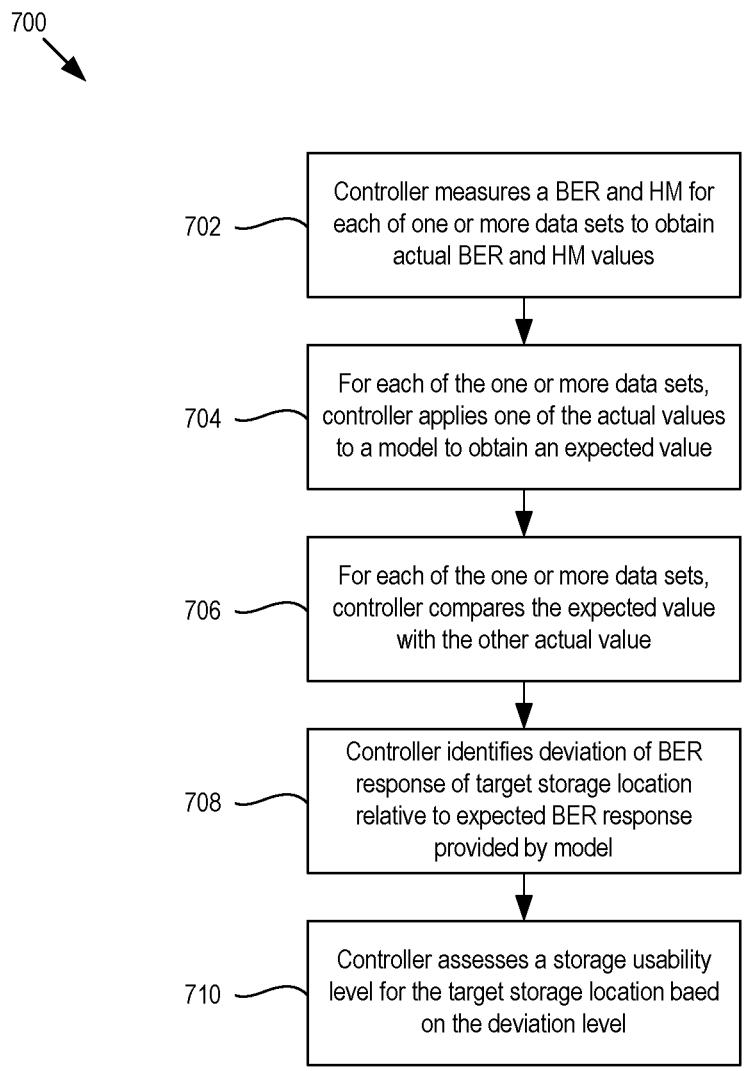
FIG. 7 is a flow chart of an example method of measuring a target storage location's actual bit error rate response relative to an expected BER response provided by a BER model.

FIG. 7 shows a flow chart of an example method 700 of measuring a target storage location's actual BER response relative to an expected BER response provided by a BER model. At block 702, a controller of a non-volatile memory system may measure a BER and a HM for each of one or more data sets stored in a target storage location to obtain actual BER and HM values associated with each of the data sets. At block 704, for each of the one or more data sets, the controller may apply one of the actual values to a model to obtain an expected or estimated value, as previously described. For example, the controller may apply the actual HM value to obtain an expected or estimated BER value, or may apply the actual BER value to obtain an expected or estimated HM value.

At block 706, for each of the one or more data sets, the controller may compare the expected or estimated value with the other actual value that was not applied to the model. For example, if the controller obtained an expected BER value, the controller may compare the expected BER value with the actual BER value. Alternatively, if the controller obtained an expected HM value, the controller may compare the expected HM value with the actual HM value. At block 708, the controller may identify a deviation level of the BER response of the target storage location relative to the expected BER response provided by the BER model. If a single data set was measured at block 702, then the deviation level may be indicated by a difference between the expected value and the actual value, which may be determined based on the comparison performed at block 706. If multiple data sets were measured at block 702, then the controller may determine an average of the differences between associated expected values and actual values. The deviation level may then be indicated by the average of the differences. At block 710, the controller may perform one or more further processing operations based on the deviation level. For example, the controller may identify a storage usability level for the target storage location by comparing the deviation level with one or more thresholds, and/or send the deviation level to a host system or other external computing device, as previously described.

Figure 8:
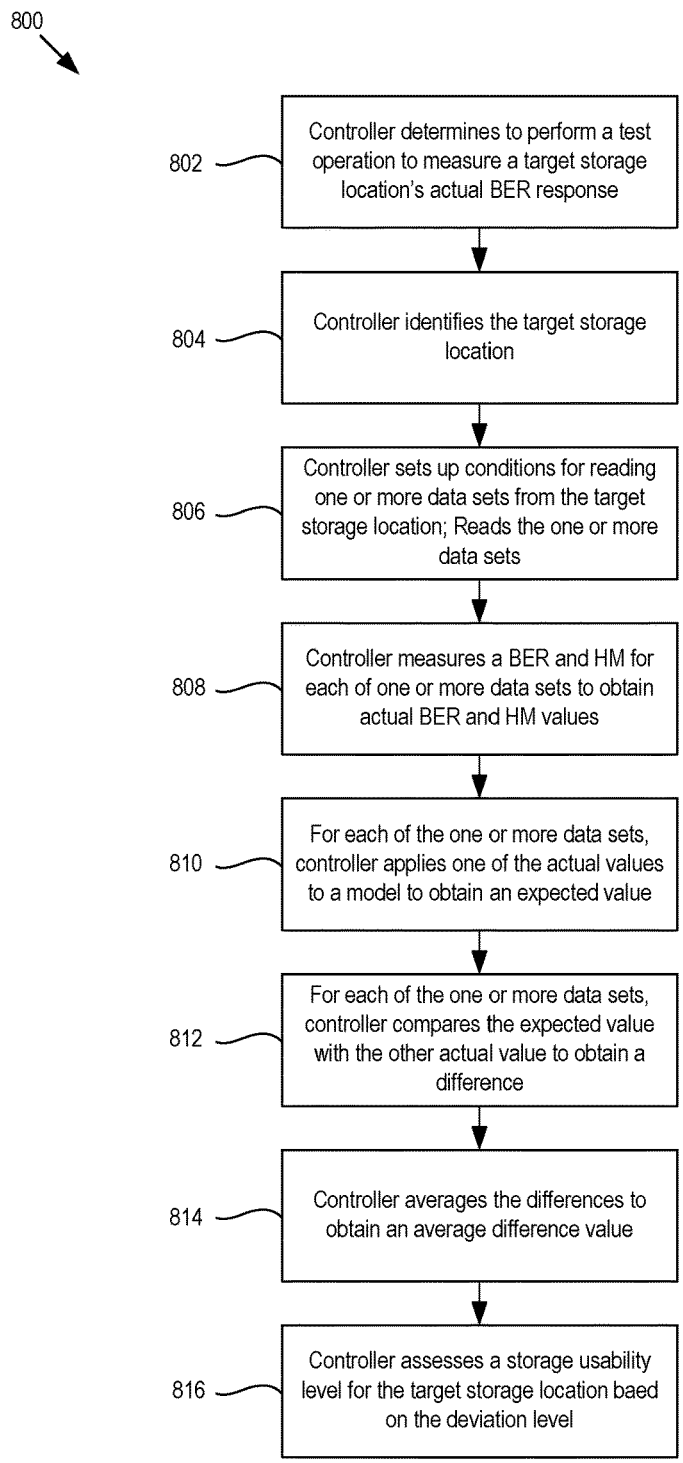
FIG. 8 is a flow chart of another example method of measuring a target storage location's actual bit error rate response relative to an expected BER response provided by a BER model.

FIG. 8 shows a flow chart of another example method 800 of measuring a target storage location's actual BER response relative to an expected BER response provided by a BER model. At block 802, a controller of a non-volatile memory system may determine to perform a test operation to measure the target storage location's actual BER response. The controller may make the determination based on receipt of a host command, or a detection of an internal triggering event, as previously described. At block 804, the controller may identify the target storage location. The target storage location may be chosen at random, may be part a larger group of target storage locations being tested, and/or may be correlated with the determination to perform the test operation, as previously described.

At block 806, the controller may setup the conditions to read one or more data sets from the target location, and read the data sets from the target storage location. For some example methods, the controller may determine to read the one or more data sets while being the target storage location is being subjected to an error-conducive condition. In some of these methods, the controller may determine to store one or more data sets in the target storage location, such as if the target storage location is not already storing any data or if the controller determines to store new data in the target storage location. For some of these methods, the controller may determine to program the one or more data sets at elevated levels in order to create an error-conducive condition. In addition or alternatively, the controller may determine to create a physical disturbance or physical stress at or near the target storage by performing a series memory operations near the target location. In addition or alternatively, the controller may read the one or more data sets at elevated read levels. The one or more data sets that are read may be loaded into a temporary storage location, such as a RAM.

At block 808, for each of the one or more data sets, the controller of a non-volatile memory system may measure a BER and a HM to obtain actual BER and HM values associated with each of the one or more data sets. At block 810, for each of the one or more data sets, the controller may apply one of the actual values to a model to obtain an expected or estimated value, as previously described. For example, the controller may apply the actual HM value to obtain an expected or estimated BER value, or may apply the actual BER value to obtain an expected or estimated HM value.

At block 812, for each of the one or more data sets, the controller may compare the expected or estimated value with the other actual value that was not applied to the model. For example, if the controller obtained an expected BER value, the controller may compare the expected BER value with the actual BER value. Alternatively, if the controller obtained an expected HM value, the controller may compare the expected HM value with the actual HM value. Based on the comparison, the controller may identify a difference between the expected or estimated value and the other actual value for each of the one or more data sets. At block 814, the controller may determine an average difference of the differences calculates at block 812. If only one difference was calculated at block 812, then the average may be the one difference, or the averaging calculation performed at block 814 may be skipped. The average difference (or the sole difference) may be indicative of a deviation level of the BER response of the target storage location relative to the expected BER response provided by the model At block 816, the controller may perform one or more further processing operations based on the deviation level. For example, the controller may identify a storage usability level for the target storage location by comparing the deviation level with one or more thresholds, and/or send the deviation level to a host system or other external computing device, as previously described.

The controller used to perform the example methods 700, 800 may be a controller of a memory system, such as the controller 102 of the memory system 100 and/or the modules or other circuit components of the controller 102 and/or the non-volatile memory system 100 as described with reference to FIGS. 1-6.

Although the above-described test operation performed with the BER model evaluation module 160 and the related methods are described in terms of bit error rate and a health meter, the described test operation may be used for one or more other parameters for which models are used to obtain expected or estimated values. In general, the test operation can be used to measure two parameters of a data set to obtain two actual parameter values. One of the actual parameter values can be applied to a model to derive an estimated or expected value of the other parameter. The estimated or expected value can then be compared with the actual value of the other parameter to obtain a difference. An average or other statistical measurement may be performed where multiple differences are obtained for a given storage location.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A storage system comprising:
a memory; and
a controller configured to:
read a data set from a target storage location of the memory;
measure a first parameter and a second parameter of the data set to obtain a first actual value of the first parameter and a second actual value of the second parameter;
apply the first actual value or the second actual value to a model; and
based on the application, identify a deviation level of the target storage location relative to the model.

2. The storage system of claim 1, wherein the controller is further configured to:
in response to the application, derive an expected value corresponding to one of the first actual value or the second actual value; and
compare the expected value with the other of the first actual value or the second actual value,
wherein the identification of the deviation level is based on the comparison.

3. The storage system of claim 1, wherein the controller is further configured to:
compare the deviation level with a threshold value; and
identify the target storage location as unusable when the deviation level exceeds the threshold.

4. The storage system of claim 1, wherein the controller is further configured to:
compare the deviation level with a plurality of thresholds; and
categorize the target storage location as being in one of at least three storage usability categories based on the comparison.

5. The storage system of claim 1, wherein the controller is configured to read the data set and measure the first parameter and the second parameter of the data set during a test phase, and
wherein during a normal operation phase, the controller is configured to measure the first parameter or the second parameter to identify an estimated value of the other of the first parameter or the second parameter.

6. The storage system of claim 1, wherein the controller is further configured to create an error-conducive condition at or near the target storage location before or while reading the data set from the target storage location.

7. The storage system of claim 1, wherein one of the first parameter or the second parameter is a bit error rate.

8. The storage system of claim 7, wherein the other of the first parameter or the second parameter is a syndrome weight or a generalized syndrome weight.

9. A storage system comprising:
a memory; and
a controller configured to:
for each of the plurality of data sets stored in a target storage location:
measure a first parameter to obtain an associated first actual value and a second parameter to obtain an associated second actual value;
apply the associated first actual value to a model to derive an associated expected value of the second parameter; and
determine an associated difference between the associated expected value and the associated second actual value;
after associated differences are determined for each of the plurality of data sets, calculate an average difference value for the plurality of data sets; and
identify a storage usability level for the target storage location based on the average difference value.

10. The storage system of claim 9, wherein the controller is further configured to:
compare the average difference value with a threshold value; and
identify the storage usability level as unusable when the average difference value exceeds the threshold.

11. The storage system of claim 9, wherein the controller is further configured to:
compare the average difference level with a plurality of threshold values; and
identify the storage usability level as being one of at least three storage usability levels based on the comparison.

12. The storage system of claim 9, wherein the controller is configured to measure the first parameter and the second parameter for each of the plurality of data sets during a test phase, and
wherein during a normal operation phase, the controller is configured to measure one of the first parameter or the second parameter to identify an estimated value of the other of the first parameter or the second parameter.

13. The storage system of claim 9, wherein the controller is further configured to create an error-conducive condition at or near the target storage location before or while reading the plurality of data sets from the target storage location.

14. The storage system of claim 9, wherein one of the first parameter or the second parameter is a bit error rate.

15. The storage system of claim 14, wherein the other of the first parameter or the second parameter is a syndrome weight or a generalized syndrome weight.

16. A method of analyzing a response of a target storage location, the method comprising:
analyzing, with a controller, a data set to obtain a first actual value of a first parameter and a second actual value of a second parameter of a data set stored in the target storage location of a memory;

applying, with the controller, the first actual value to a model to obtain an estimated value of the second parameter; and identifying a deviation level of the target storage location relative to an estimated response indicated by the model.

17. The method of claim 16, further comprising:

comparing, with the controller, the deviation level with a threshold value; and identifying, with the controller, the target storage location as unusable when the deviation level exceeds the threshold.

18. The method of claim 16, further comprising:

comparing, with the controller, the deviation level with a plurality of thresholds; and categorizing, with the controller, the target storage location as being in one of at least three storage usability categories based on the comparing.

19. The method of claim 16, further comprising:

determining, with the controller, to perform a test operation, wherein analyzing the data set, applying the first actual value to the model, and identifying the deviation level is in response to determining to perform the test operation.

20. The method of claim 16, further comprising:

creating, with the controller, an error-conducive condition at or near the target storage location; and reading, with the controller, the data set after or while creating the error-conducive condition.

21. A storage system comprising:

a memory;

means for reading a data set from a target storage location of the memory;

means for measuring a first parameter and a second parameter of the data set to obtain a first actual value of the first parameter and a second actual value of the second parameter;

means for applying the first actual value or the second actual value to a model; and means for identifying a deviation level of the target storage location relative to the model based on the application.

* * * * *